United States Patent [19]

Sugawara et al.

[11] 4,100,562
[45] Jul. 11, 1978

[54] LIGHT COUPLED SEMICONDUCTOR DEVICE AND METHOD OF MANUFACTURING THE SAME

[75] Inventors: Yoshitaka Sugawara; Tsutomu Yatsuo; Nobutake Konishi, all of Hitachi, Japan

[73] Assignee: Hitachi, Ltd., Japan

[21] Appl. No.: 678,171

[22] Filed: Apr. 19, 1976

[30] Foreign Application Priority Data

Apr. 30, 1975 [JP] Japan .................................. 50-52390

[51] Int. Cl.² ............................................. H01L 31/12
[52] U.S. Cl. ....................................... 357/19; 357/17; 250/551
[58] Field of Search ............................ 357/19, 17, 18; 250/551

[56] References Cited

U.S. PATENT DOCUMENTS

| | | | |
|---|---|---|---|
| 3,760,237 | 9/1973 | Jaffe | 317/234 R |
| 3,976,877 | 8/1976 | Thillays | 250/227 |

*Primary Examiner*—Martin H. Edlow
*Attorney, Agent, or Firm*—Craig & Antonelli

[57] ABSTRACT

A light emitting semiconductor device and a light detecting semiconductor device are coupled optically with each other through a light guide. The light guide is made of a single piece of light transmissible insulating material and at least its end portion associated with the semiconductor light detector is brought into wet contact with a light sensing region of the semiconductor light detector including its neighboring area. While being in fluid state, the light transmissible insulator held in wet contact with the semiconductor light emitter and detector is shaped into a predetermined configuration and thereafter hardened to form the light guide.

17 Claims, 17 Drawing Figures

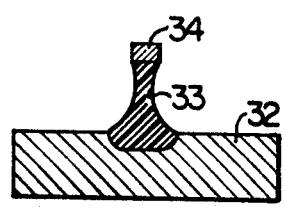
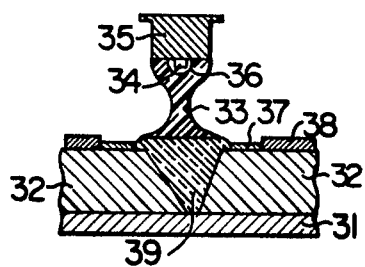
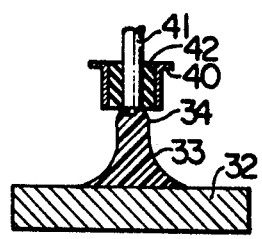
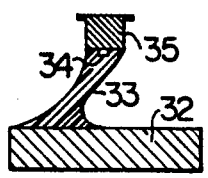
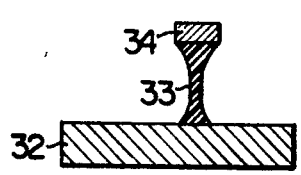
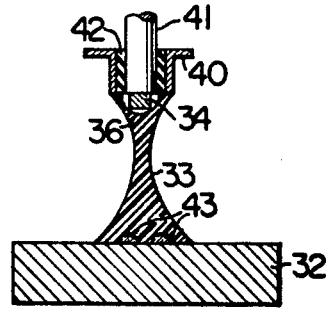

LIGHT COUPLED SEMICONDUCTOR DEVICE AND METHOD OF MANUFACTURING THE SAME

BACKGROUND OF THE INVENTION

1. Field of the Invention

This invention relates to a light coupled semiconductor device which comprises a light emitting semiconductor element and a light sensing semiconductor element optically and integrally coupled with the light emitting semiconductor element and to a method for manufacturing the same.

2. Description of the Prior Art

Hitherto, this type of light coupled semiconductor device has been known as a photo-coupler. A photo-coupler which affords a signal transmission between its input and output sides which are electrically insulated from each other is being widely used especially for transmitting signals between circuits at different potentials or for effecting high-power controlling through the use of weak signals.

A prior art light coupled semiconductor device is disclosed in U.S. Pat. No. 3,535,532 issued on Patent Application Ser. No. 820,037 filed Apr. 21, 1969 by the name of Jerry D. Merryman, assigned to Texas Instruments Inc. and entitled to "Integrated Circuit including Light Source, Photodiode and associated Components". The prior art device comprises a light emitting semiconductor element and a light sensing semiconductor element with their principal surfaces being arranged oppositely on which the light emitting area and light sensing area are provided respectively, and a light guide made of glass for optically coupling the light emitting area to the light sensing area. This prior art light coupled semiconductor device, however, is disadvantageous in that although the light emitting area and the light sensing area occupy only a part of the respective principal surface, the light guide is held in contact at their respective ends with the principal surfaces to cover not only the portions where the light emitting and sensing areas are provided, but also the peripheral portions thereof and as a result, the optical coupling efficiency is considerably degraded.

SUMMARY OF THE INVENTION

An object of this invention is to provide a light coupled semiconductor device of high optical coupling efficiency and adapted to be applied to mass production.

Another object of the invention is to provide a method for manufacturing such light coupled semiconductor devices.

According to the invention, this object can be accomplished by optically coupling a light emitting area of the light emitting semiconductor element to a light sensing area of the light sensing semiconductor element through a light guide which is made of a single piece of light transmissible insulating material and whose respective ends are brought into wet contact with the respective areas and their neighborhoods. The term "light emitting area" is used to denote a surface of the semiconductor substrate from which light emanates, or if such a surface is coated with a layer of resin or glass, the surface of the coating layer, or if the semiconductor substrate is mounted to a stem and the stem reflects light emanated from the semiconductor substrate toward the light sensing semiconductor element, the reflecting surface of the stem. The term "light sensing area" is used to call the portion of a semiconductor element having a light sensitive p-n junction which is an exposed portion of a depletion layer including its neighboring area within the diffusion length of carrier, which depletion layer is formed by reversely biasing the p-n junction. With a light coupled semiconductor device of such construction, since the one end of the light guide associated with the light sensing semiconductor element is held in wet contact only with the light sensing area including its neighborhood (in case of a circular light sensing area, the diameter of a neighboring area does not exceed 1.2 times as large as that of the light sensing area), the light emanating from the light emitting semiconductor element is totally irradiated upon the light sensing area, thereby improving optical coupling efficiency of the device. This effect contributes to saving of the light emitting output of the light emitting semiconductor element and long lifetime thereof.

More specifically, the light coupled semiconductor device of the invention is characterized in that a side surface of the body of the light guide, whose opposite ends are attached to the light emitting area and the light sensing area, respectively, is concaved with respect to a surface defined by straight lines connecting points on the periphery of the one end of the body to points on the periphery of the other end, point to point through the shortest path therebetween. The light guide of this configuration contributes to easy application to mass production of the light coupled semiconductor devices without degrading the optical coupling efficiency.

According to the invention, a method of manufacturing a light coupled semiconductor device is characterized by the steps of bringing a fluid light guide material into wet contact with a light emitting area of a light emitting semiconductor element and a light sensing area of a light sensing semiconductor element, forming into a predetermined configuration the light guide material by adjusting positional relationship between the light emitting area and the light sensing area and/or the quantity of the light guide material, and then hardening the light guide material. When a light coupled semiconductor device is manufactured in accordance with this method, the light guides can be prepared easily substantially in the same configuration with high reproductivity, thereby the productivity of mass production of the device being improved. This method is conveniently applied to preparation of a light guide connecting a light sensing area to a light detecting area which is different in configuration from the light sensing area.

BRIEF DESCRIPTION OF THE DRAWINGS

FIGS. 6a to 6f are schematic longitudinal section views of different embodiments of the invention.

DESCRIPTION OF THE PREFERRED EMBODIMENTS

Figure 1:
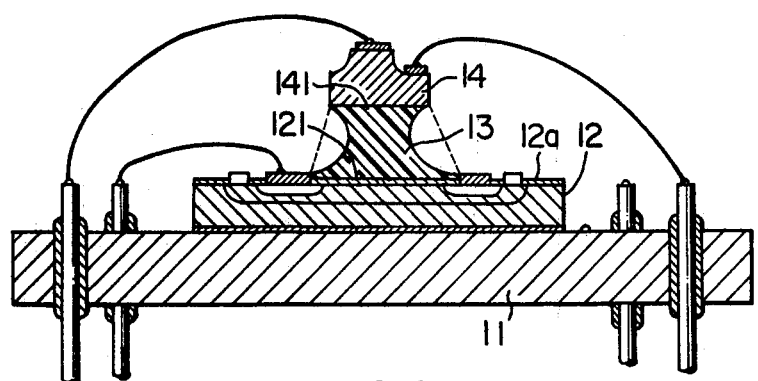
FIG. 1 is a schematic longitudinal section view showing one embodiment of the light coupled semiconductor device of the invention.

Reference is now made to FIG. 1 of the accompanying drawings, which illustrates a low-power light coupled semiconductor device embodying the invention by way of an example. In the figure, a light sensor 12 such as a silicon photo-transistor secured on a stem 11 and a light emitter 14 such as a GaAs light emitting diode opposed to the light sensor 12 are coupled optically through a light guide 13 made of epoxy resin. The light guide 13 has a cross-section which is smaller at its intermediate portion than its end portions closer to the light emitter and the light sensor so that a side surface of the light guide 13 is concaved inside an imaginary surface, as shown by dotted lines, which would be formed if the periphery of the light emitting area 141 of the light emitter 14 extends to the periphery of the light sensing area 121 of the light sensor 12 through straight lines passing the shorter paths therebetween. The opposite ends of the light guide 13 are held in wet contact with the light emitting area 141 and the light sensing area 121 without forming substantial air gaps at the contacting interfaces thereby to greatly improve the optical coupling efficiency. A silicon oxide film designated at 12a covers the surface of the light sensor.

Figure 2:
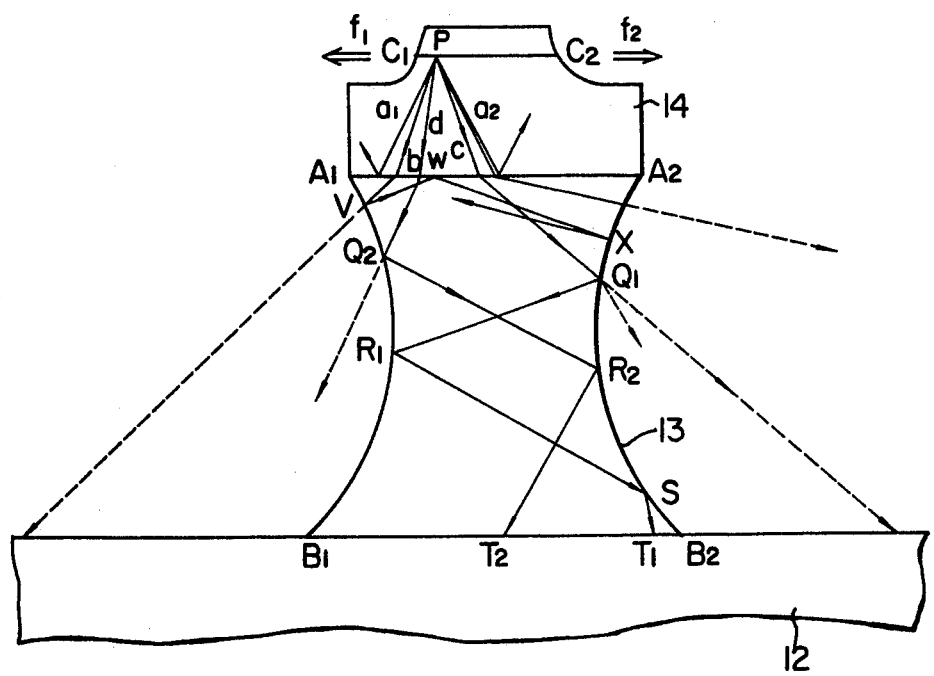
FIG. 2 is a schematic representation for explaining operation of the device shown in FIG. 1.

FIG. 2 is useful to explain operation of the device shown in FIG. 1 and illustrated therein are typical paths of light emanating from a point P on the GaAs junction of the light emitter 14.

Light beams $a_1$ and $a_2$ incident to a GaAs interface A1-A2 at an angle larger than its critical angle for transmission (about 27°) are subjected to total reflections and almost absorbed in the GaAs substrate. The light beams incident to the interface at angles less than the critical angle are partly reflected at the GaAs interface but almost pass through the GaAs substrate. Among the light beams passing therethrough, a light beam $b$, for example, repeats reflections at points V, W and X. During the reflections, the light beam $b$ is partly refracted at the boundary of the light guide, going out therefrom as shown at a dotted line, and otherwise absorbed in the epoxy light guide and the GaAs substrate. Another light beam C is reflected at points $Q_1$, $R_1$ and S, partly going out of the light guide and partly being directed to a point $T_1$ on the light sensing area B1-B2 of the light sensor 12. Still another light beam $d$ incident to the curved surface of the epoxy body at an angle more than its critical angle for transmission (about 41°) is totally reflected at points $Q_2$ and $R_2$ and directed to a point $T_2$ on the light sensing area. Thus, the light sensing area B1-B2 receives all of such light beams transmitted through the light guide in the last-mentioned manner.

With the construction of the invention as has been described hereinbefore, light emanating from the light emitter 14 is optically and efficiently guided through the optically continuous light guide 13 and irradiated upon the light sensing area B1-B2 of the light sensor 12 so that the optical coupling efficiency between the light emitter and light sensor is greatly improved.

Referring to FIGS. 3a to 3d, a manufacturing method for the device of FIG. 1 will be explained by way of an example.

Figure 3A:
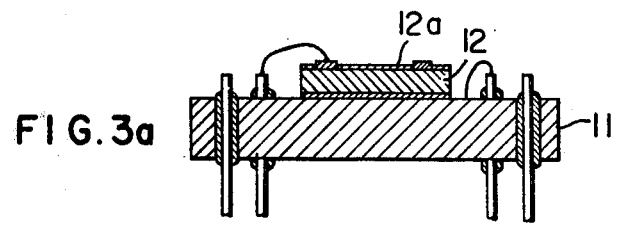
FIGS. 3a to 3d are longitudinal section views for explaining manufacturing steps of the device shown in FIG. 1.
Figure 3B:
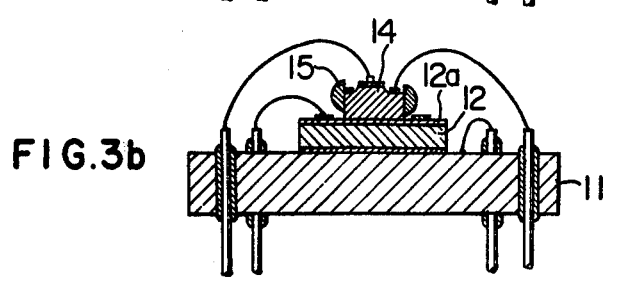
Figure 3C:
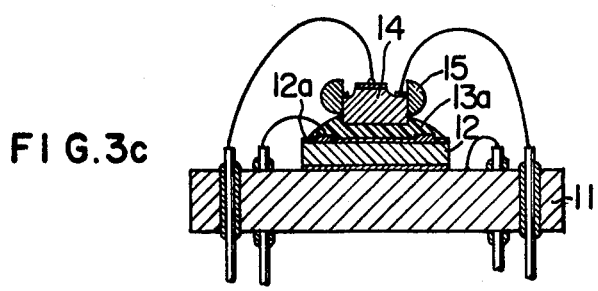
Figure 3D:
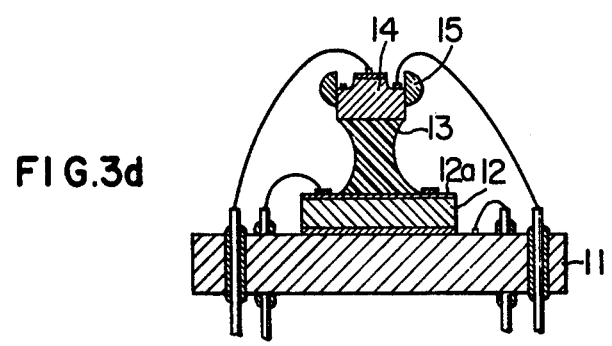

As shown in FIG. 3a, the light sensor 12 of silicon photo-transistor is first secured onto the surface of the stem 11 made of such as an iron-nickel-cobalt alloy by brazing with Au-Si alloy material, and the electrode provided for the light sensor 12 is connected to a corresponding lead of the stem through a gold wire or the like. Next, as shown in FIG. 3b, the light emitter 14 including GaAs light emitting diode is supported by a tool 15 on the light sensor 12 and under this condition, electrodes of the light emitter are connected to corresponding leads of the stem through golden wires, for example. Thereafter, as shown in FIG. 3C, the light emitter 14 is moved upwards by the tool 15 to be separated from the surface of the light sensor 12 by a predetermined distance, and a predetermined quantity of fluid epoxy resin as light guide material is poured into a small space thus established between the light emitter and sensor to form a resin layer 13a, which is brought into wet contact with the light emitter and sensor. A portion of the resin layer 13a closer to the light sensor 12 is held in wet contact with the silicon oxide film 12a. Then, as shown in FIG. 3d, the light emitter 14 is further moved by the tool 15 to a predetermined height above the light sensor 12 to shape the resin layer 13a into a desired configuration of light guide and then, the resin layer is hardened through heat treatment. In this manner, the light guide 13 directly coupling the light emitter and the light sensor is prepared. Finally, by removing the tool 15 and sealing the light emitter and sensor mounted to the stem 11 in a known manner, a desired light coupled semiconductor device can be manufactured. The light guide 13 prepared in the above manner has an intricate configuration which is determined by various factors such as a surface tension of the epoxy resin assumes just before its hardening, a surface tension of the GaAs substrate, a surface tension of the silicon oxide film, an interfacial tension created between the GaAs substrate and the epoxy resin, an interfacial tension created between the silicon oxide film and the epoxy resin, a cohesive force of the epoxy resin, a specific gravity, viscosity and volume of the epoxy resin, a distance between the light emitter and sensor, and shapes of respective contacting surfaces of the light emitter and the light sensor.

However, since the epoxy resin will assume a contact angle less than 90° in relation to the GaAs substrate and the silicon oxide ($SiO_2$) and hence undergo excellent wet contact with them, it is possible to form with ease and high yield rate the light guide 13 constricted at its intermediate portion as shown in section in FIG. 1 by pouring a controlled quantity of the epoxy resin.

Actually, under the condition that the light emitter 14 was a GaAs light emitting diode with the surface A1-A2 of 500 $\mu m^2$ and the surface C1-C2 of 350 $\mu m$ in diameter, the light sensor 12 was a silicon photo-transistor with the surface B1-B2 of 800 $\mu m$ in diameter, and the distance between the light emitter and sensor was about 500 $\mu m$, it was found that the light guide 13 prepared by pouring and hardening a small amount of epoxy resin (about $2 \times 10^{-4}$ cc) between the light emitter and sensor was capable of providing a base-collector photo-current of the photo-transistor 2.1 times as large as that given by a conventional light guide of glass plate having a 500 $\mu m$ thickness interposed between the light emitter and sensor. In a similar comparison with a photo-transistor having a 400 $\mu m \times 800 \mu m$ rectangular light sensing area, it followed that a photo-current increased twice, as much. It should be understood from these experimental results that the construction of this invention is effective in improving the optical coupling efficiency.

The above-mentioned process for preparing the light guide comprises forming a fluid layer of light guide material between the light emitter and sensor, adjusting the positional relations between the light emitter and sensor, shaping the light guide layer under the wet contacting condition, and hardening the light guide layer after the adjustment and shaping. However, the process is not necessarily limited to being performed in the order as described with reference to FIGS. 3a to 3d, but such a modified process as described below may be available.

Returning to FIG. 3a, a predetermined quantity of fluid epoxy resin of light guide material is dropped on the light sensor which is previously formed with a barrier around the light-sensitive region of the light sensor for the purpose of preventing the epoxy resin from flowing out. Such a barrier may be a step barrier provided along the periphery of the light sensing area formed by photo-etching the $SiO_2$ film 12a, the metallic layer for electrode, or a glass layer if used in place of the $SiO_2$ film 12a. The epoxy resin is deposited into the form of a ball inside the barrier. Thereafter, the bottom (including the light emitting area) of the light emitter supported by the tool 15 is brought into wet contact with the ball-shaped epoxy resin. If necessary, the light emitter is raised a predetermined height by means of the tool 15 and the epoxy resin is shaped into a light guide configuration, and then it is hardened to complete a light guide. Finally, lead wires are applied to the light emitter and the tool 15 is removed.

Figure 4:
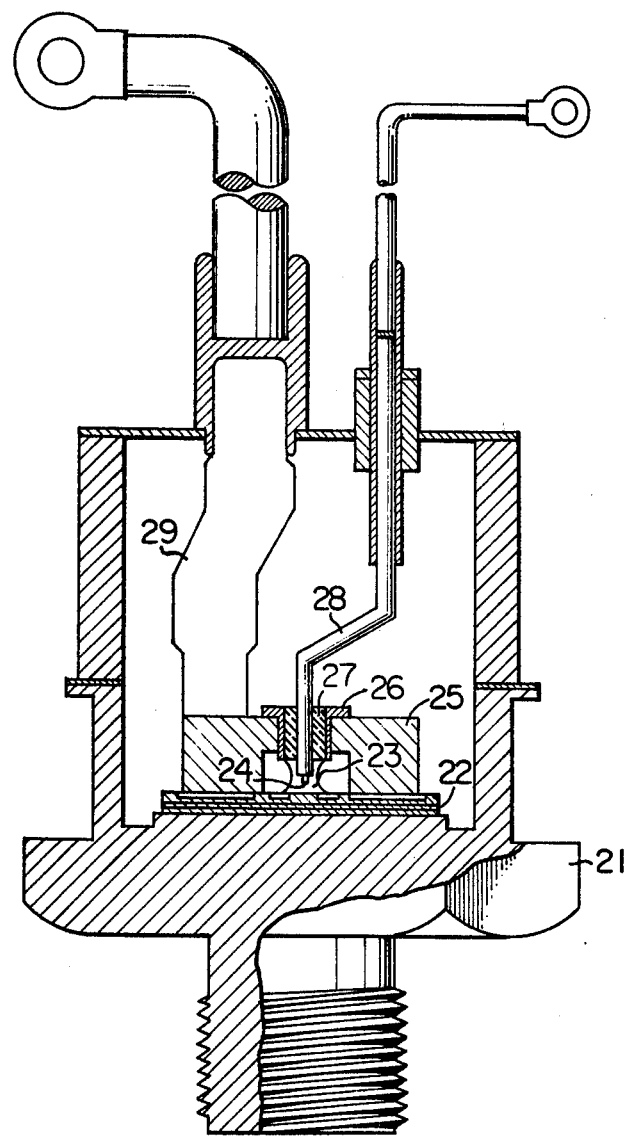
FIG. 4 is a schematic longitudinal section view showing another embodiment of the light coupled semiconductor device of the invention.

Turning to FIG. 4, a high-power light coupled transistor device embodying the invention will be described. This device comprises a light emitter 24 exemplified as a GaAs light emitting diode and a light sensor 22 exemplified as a 1200 V and 100 A class photo-thyristor with internal gate current amplification which are coupled optically with each other through a light guide 23 in accordance with the present invention, and has features in that it is capable of controlling an output of high power by a signal of low-power. The light sensor 22 is fixed between a lower electrode in the form of a stud 21 and an upper electrode 25 connected to a main lead 29, a cylindrical member 26 with a glass sleeve 27 through which a control terminal lead 28 passes is fitted in a hole formed in the upper electrode 25, and the light emitter 24 buried in the light guide 23 is mounted to the tip of the lead 28.

Figure 5A:
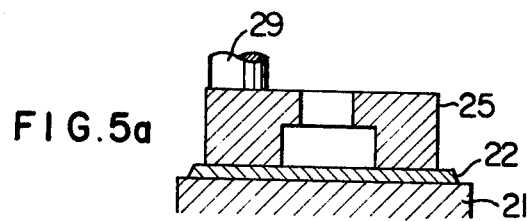
FIGS. 5a to 5d are longitudinal section views for explaining manufacturing steps of the device shown in FIG. 4.
Figure 5B:
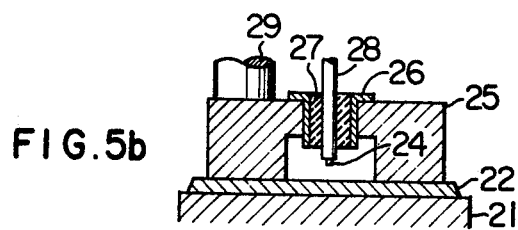
Figure 5C:
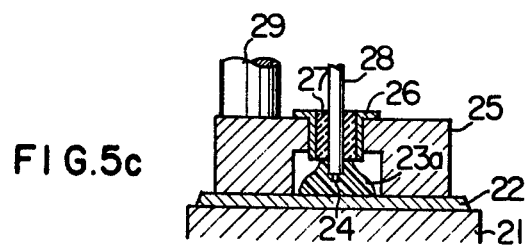
Figure 5D:
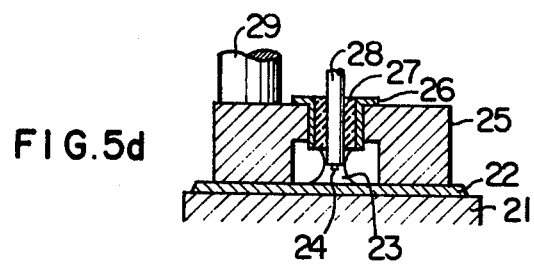

Referring now to FIGS. 5a to 5d, a manufacturing method for the device shown in FIG. 4 will be explained by way of an example. First, as shown in FIG. 5a, on the upper surface of the stud 21 made of such as copper is secured the light sensor 22 of a photo-thyristor on which the upper electrode 25, in turn, is mounted. Next, as shown in FIG. 5b, the stem including the glass sleeve 27 supporting the lead 28 provided at its tip with the light emitter 24 and the cylindrical member 26 made of such as iron-nickel-cobalt alloy is fitted, positioned and fixed in the hole of the upper electrode 25. Thereafter, as shown in FIG. 5C, the fluid epoxy resin as the light guide material is poured between the stem and the light sensor and a resin layer 23a is so formed as to be brought into wet contact with the glass sleeve 27, light emitter 24 and light sensing area of the light sensor 22. Further, as shown in FIG. 5d, the resin layer is shaped into a light guide configuration by sucking out and removing a part of the resin layer 23 by means of, for example, an injector or a wick made of, for example, filter paper, and hardened through heat treatment to complete the intended light guide 23. Finally, by sealing the resultant structure in a well-known manner, the device of FIG. 4 can be obtained. In this embodiment, the amplifying electrode of the photo-thyristor may be used as a barrier as previously mentioned in preparation of the light guide.

The basic mechanism of light guide effect obtainable from the light guide 23 is the same as described hereinbefore. In order to promote the light guide effect, according to this embodiment, the lead 28 made of copper or the like material is disposed so that its tip mounted with the light emitter 24 is projected out of the glass sleeve 27 so as to exceed the narrowest portion of the light guide 23 and extend near to the light sensor. With this construction, those light components partly refracted to leak out of the light guide which have been referred to as the light beams b and c with reference to FIG. 2 can be reduced, the other light component subjected to the total reflection at the epoxy resin boundary such as the light beam d can be increased and even light beams emanating from the side surface of the light emitter (light components designated at $f_1$ and $f_2$ in FIG. 2) can be utilized, so that the optical coupling efficiency can be improved more greatly.

Under the condition that the light emitter 24 was a rectangular GaAs diode with 400 $\mu m^2$ junction area and 200 $\mu m$ of thickness, the light sensor 22 was a photo-thyristor with internal gate current amplification with a wafer of 20 mm diameter having a central light sensing area of 2 mm diameter, a distance between the light emitter and sensor was about 0.7 mm, a distance between the stem glass sleeve 27 and the light sensor 22 was about 1.2 mm, and a small quantity (about $3 \times 10^{-3}$ cc) of the epoxy resin was preserved to form the light guide 23, a device as shown in FIG. 4 was manufactured. The thyristor of the device thus manufactured was started with ease by conducting a 45 mA current to the light emitter 24. Considering the fact that a starting current of about 240 mA is needed with a device of a similar construction wherein a gap between the light emitter and the thyristor is filled with $N_2$ gas and that an ignition current of about 117 mA is needed with another device of a similar construction wherein the gap is filled with an epoxy resin, it should be understood that the ignition current for the device manufactured in accordance with this experimental embodiment is reduced to a great extent and in other words, the optical coupling efficiency is greatly improved.

Incidentally, it is well-known that the lifetime of the high-power light coupled semiconductor device as described hereinbefore is dependent upon that of the light emitting element and that a large density of conduction current through the light emitter as well as a large temperature rise in the light emitting junction due to the conduction current greatly enhance degradation of the light emitting output. In the light coupled semiconductor device incorporated with the light guide in accordance with the invention, since it is possible to decrease the density of conduction current through the light emitter by one-half as compared with a device of the type incorporated with a light guide of a simple resin layer and to suppress the temperature rise to a minimum (for this experimental embodiment, less than about 35° C), the lifetime of the device can readily be extended by five to eight times, amounting to about $10^5$ hours.

While, in the foregoing description, the basic technical idea of the invention and operations and effects thereof have been described by way of embodiments, the invention is not limited to those embodiments and may be embodied in the form of various modifications.

FIGS. 6a to 6e show other modifications according to this invention. The modification shown in FIG. 6a is advantageously applied to a light sensor in which its high sensitive part is formed at its inner portion remote to its principal surface. For example, in case of photo-thyristor, the high sensitive part is at its central p-n junction neighbourhood which is reversely biased when a forward bias is applied between its main electrodes. In such a high sensor, the light incident to its principal surface is greatly absorbed before the light reaches the high sensitive part, resulting in great reduction of its sensitivity. In the device shown in FIG. 6a, in order to prevent such reduction of the sensitivity, the light sensor 32 is formed with an etched groove so as to have its high sensitive part exposed to the surface of the groove and the light guide 33 couples optically the light emitter 34 and the surface of the groove where the high sensitive part is exposed to. Since a passivation coating such as an SiO$_2$ film is formed after etching, a light guide made of a material having high ability for wet contact with the SiO$_2$ film easily affords a high optical coupling efficiency between a small rectangular light emitting area and a large circular concaved light sensing area.

In a modification shown in FIG. 6b, the light emitter 34 covered with a coating 36 and the light sensor 32 provided, at the light sensing area, with a passivation coating 39 (for example, made of glass or silicon system resin) other than an SiO$_2$ film 37 are optically coupled with each other through a light guide 33. The light emitter 34 mounted to a stem 35 is covered with the coating 36 of, for example, glass or the like material so as to make less strict the total reflection condition thereby to improve light deriving efficiency, and the light sensing area of the light sensor mounted to an electrode member 31 is also covered with the coating 39. The light guide 33 of the invention can easily be applied even to such arrangement. In FIG. 6b, numeral 38 designates an electrode layer.

FIG. 6C shows another modification wherein the light guide 33 is formed into a configuration which permits more effective utilization of light beams emanating from the side surface of the light emitter 34. Namely, the light guide 33 shown therein is varied in its cross-sectional area such that the cross section gradually increases at a portion surrounding the light emitter 34, becomes substantially constant at the intermediate portion and again gradually increases in the vicinity of the light sensor 32. The light guide 33 of this configuration can readily be prepared by, for example, interposing between a cylindrical member 40 and a lead 41 a layer 42 of an insulation material (for example tetrafluoethylene) having an insufficient wet contact property with an epoxy resin, building the epoxy resin to surround the light emitter 34 while bringing it into wet contact with the tip of the lead 41 having excellent wet contact property with the epoxy resin and the light sensing area, and hardening the epoxy resin. Since the light guide of this configuration has an additional function to focus light beams emanating from the side surface of the light emitter and reflect them toward the light sensor, the optical coupling efficiency can be improved about 30% to 50% as compared with the light guide as shown in FIG. 1 or FIG. 4.

FIG. 6d shows another modification wherein the light emitter 34 and the light sensor 32 are arranged such that the light emitting area and the light sensing area are offset from each other, and the light guide 33 is formed in accordance with the invention between the light emitter and sensor FIG. 6e shows a further modification wherein the light sensor 32 with a relatively small light sensing area and the light emitter 34 with a relatively large light emitting area are coupled with each other through the light guide 33. The light guides 33 as shown in FIGS. 6d and 6e can readily be prepared by using a resin of a relatively large viscosity and rapidly hardening the resin. For example, alicyclic epoxy resin mixed with a hardening agent of hexa-hydrophtalic acid is subjected to a slow hardening reaction for 40 to 50 hours at about 40° C to thereby make 700 to 1200 pois the viscosity of the epoxy resin, the resin is shaped into the light guide configuration while bringing it into wet contact with the given light emitting area and light sensing area, and thereafter a resultant structure of the resin is subjected to a rapid and high temperature hardening treatment, thereby the light guide of the desired configuration being readily be prepared.

FIG. 6f shows a still further modification wherein in order that preselected areas on the highly sensitive region of the light sensor 32 are irradiated with a large amount of light, focussing means 43 (lens or the like member) are disposed in alignment with the preselected areas. It will readily be inferred by experts in this field that the focussing means are preferably made of a resin, glass or semiconductor having a larger refraction index than that of the material for the light guide 33 and that various configurations of the focussing means other than the configuration illustrated in the figure are available. The last modification includes a plurality of light sensing elements integrated into a light sensor unit and suitable for use with some of the light sensing elements being irradiated at a larger intensity of illumination than the remaining light sensing elements.

While, in the foregoing description, the epoxy system resin has mainly been referred to as the material for the light guide, the material therefor is not limited to this but, as required, various resins of silicon system resins, poly-imide system resins or the like or various low melting point glasses may be employed. In case where a low melting point glass is used as the light guide material, the invention may be materialized by building a column-shaped light guide in advance, and melt-bonding the light emitting and sensing areas directly to respective ends of the light guide.

We claim:

1. A light coupled semiconductor device comprising:
    a light emitting semiconductor element having a surface with at least a part of said surface providing a light emitting area,
    a light sensing semiconductor element having a surface with at least a part of said surface providing a light sensing area, said light sensing area facing said light emitting area, and
    a light guide made of a single member of light transmissible material and having two opposite end surfaces, one of which is held in wet contact with the light emitting area and the other of which is held in wet contact with said light sensing area so as to not substantially extend beyond said light sensing area.

2. A light coupled semiconductor device according to claim 1, wherein said light guide has an elongated portion extending between said two end surfaces, said elongated portion having a longitudinal concave exterior surface.

3. A light coupled semiconductor device according to claim 2, wherein said elongated portion of said light guide has a maximum cross-section at each of said two end surfaces.

4. A light coupled semiconductor device according to claim 2, wherein said concave exterior surface of said elongated portion is disposed within a space defined by a surface constituted by straight lines extending between the periphery of said two end surfaces.

5. A light coupled semiconductor device according to claim 2 wherein a step barrier is formed along the periphery of the light sensing area of the light sensing semiconductor element.

6. A light coupled semiconductor device according to claim 2 wherein the light sensing area of the light sensing semiconductor element has a stronger ability for wet contact with the light transmissible material than the peripheral neighbourhood of the light sensing area has.

7. A light coupled semiconductor device comprising:
a light sensing semiconductor element having two opposite major surfaces, and a light sensing area at a part of one of said two major surfaces,
an upper electrode contacting said one surface at a portion exclusive of said light sensing area,
a lower electrode contacting the other of said two surfaces of said light sensing semiconductor element,
a light emitting semiconductor element supported on said upper electrode and electrically insulated from said electrode, said light emitting semiconductor element having a surface with at least a part of said surface providing a light emitting area, said light emitting area facing said light sensing area, and
a light guide made of a single member of light transmissible material and having two opposite end surfaces, one of which is held in wet contact with said light emitting area and the other of which is held in wet contact with said light sensing area.

8. A light coupled semiconductor device according to claim 7, wherein said light guide has an elongated portion extending between said two end surfaces, said elongated portion having a longitudinal concave exterior surface.

9. A light coupled semiconductor device according to claim 8, wherein said light sensing semiconductor element is a thyristor operative in response to light applied thereto.

10. A light coupled semiconductor device according to claim 9, wherein said light sensing area is formed at a substantially center portion of said one surface of said light sensing semiconductor element.

11. A light coupled semiconductor device according to claim 8, wherein a step barrier is formed along the periphery of said light sensing area on said one surface of said light sensing semiconductor element.

12. A light coupled semiconductor device according to claim 8, wherein said light sensing area of said light sensing semiconductor element has a stronger ability for wet contact with said light transmissible material than the peripheral neighborhood of said light sensing area.

13. In a light coupled semiconductor device comprising a light emitting semiconductor element and a light sensing semiconductor element, each having respectively a light emitting area and a light sensing area in facing relationship, and a light guide means for transmitting light between said light emitting area and said light sensing area, the improvement comprising said light guide means being a single elongated light guide member of light transmissible material having opposite ends respectively in wet contact with said light emitting area and said light sensing area, wherein said single elongated member has a concave longitudinal surface extending between said opposite ends.

14. A light coupled semiconductor device according to claim 13, wherein said single elongated member has the respective end in wet contact only with said light sensing area of said light sensing semiconductor element.

15. A light coupled semiconductor device according to claim 13, wherein said single light guide member has a smaller cross-section at intermediate portions than at end portions which are disposed closer to said light emitting semiconductor element and said light sensing semiconductor element respectively.

16. A light coupled semiconductor device according to claim 13, wherein said concave longitudinal surface is disposed within a space defined by a surface constituted by straight lines extending between the periphery of said ends of said single light guide member.

17. A light coupled semiconductor device according to claim 13, wherein said single light guide member has a contact angle of less than 90° in relation to each of said light emitting semiconductor element and said light sensing semiconductor element.

* * * * *